United States Patent
Li et al.

(10) Patent No.: US 12,254,261 B2
(45) Date of Patent: *Mar. 18, 2025

(54) METHOD OF DESIGNING AN INTEGRATED CIRCUIT AND SYSTEM FOR DESIGNING INTEGRATED CIRCUIT

(71) Applicant: TAIWAN SEMICONDUCTOR MANUFACTURING COMPANY, LTD., Hsinchu (TW)

(72) Inventors: Jian-Sing Li, Hsinchu (TW); Jung-Chan Yang, Hsinchu (TW); Ting Yu Chen, Hsinchu (TW); Ting-Wei Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/545,268

(22) Filed: Dec. 19, 2023

(65) Prior Publication Data

US 2024/0119213 A1    Apr. 11, 2024

Related U.S. Application Data

(63) Continuation of application No. 17/362,170, filed on Jun. 29, 2021, now Pat. No. 11,853,679, which is a continuation of application No. 16/512,062, filed on Jul. 15, 2019, now Pat. No. 11,074,390.

(60) Provisional application No. 62/738,707, filed on Sep. 28, 2018.

(51) Int. Cl.
    *G06F 30/394* (2020.01)
    *G06F 30/392* (2020.01)

(52) U.S. Cl.
    CPC .......... *G06F 30/394* (2020.01); *G06F 30/392* (2020.01)

(58) Field of Classification Search
    CPC ......................... G06F 30/394; G05F 30/392
    USPC ........................................................ 716/122
    See application file for complete search history.

(56) References Cited

U.S. PATENT DOCUMENTS

| | | | |
|---|---|---|---|
| 7,260,442 B2 | 8/2007 | Hwang et al. | |
| 8,473,891 B1 * | 6/2013 | Bosshart ............... | G06F 30/392 716/139 |
| 8,566,771 B1 * | 10/2013 | Arp ....................... | G06F 30/394 716/129 |
| 9,256,709 B2 | 2/2016 | Yu et al. | |
| 11,074,390 B2 * | 7/2021 | Li ........................ | G06F 30/394 |

(Continued)

*Primary Examiner* — Jack Chiang
*Assistant Examiner* — Suchin Parihar
(74) *Attorney, Agent, or Firm* — Hauptman Ham, LLP (57) ABSTRACT

A method includes designing a plurality of cells for a semiconductor device, wherein designing the plurality of cells comprises reserving a routing track of a plurality of routing tracks within each of the plurality of cells, wherein each of the plurality of cells comprises signal lines, and the reserved routing track is free of the signal lines. The method includes placing a first cell and a second cell of the plurality of cells in a layout of the semiconductor device. The method includes determining whether any power rails overlap with any of the plurality of routing tracks other than the reserved routing track in the second cell. The method includes adjusting a distance between the first cell and the second cell in response to a determination that at least one power rail overlaps with at least one routing track other than the reserved routing track.

20 Claims, 8 Drawing Sheets

(56) References Cited

U.S. PATENT DOCUMENTS

| | | | |
|---|---|---|---|
| 2004/0145033 A1* | 7/2004 | McElvain | G06F 30/394 |
| | | | 257/659 |
| 2006/0095872 A1* | 5/2006 | McElvain | G06F 30/394 |
| | | | 716/113 |
| 2008/0134106 A1* | 6/2008 | Riviere-Cazaux | G06F 30/39 |
| | | | 716/132 |
| 2012/0110536 A1* | 5/2012 | Agarwal | G06F 30/394 |
| | | | 716/129 |
| 2012/0131528 A1* | 5/2012 | Chen | G03F 7/70433 |
| | | | 716/112 |
| 2014/0040838 A1 | 2/2014 | Liu et al. | |
| 2015/0278429 A1 | 10/2015 | Chang | |
| 2016/0342726 A1* | 11/2016 | Yuan | G06F 30/394 |

\* cited by examiner

METHOD OF DESIGNING AN INTEGRATED CIRCUIT AND SYSTEM FOR DESIGNING INTEGRATED CIRCUIT

PRIORITY CLAIM

This application is a continuation of U.S. application Ser. No. 17/362,170, filed Jun. 29, 2021, which is a continuation of U.S. application Ser. No. 16/512,062, filed Jul. 15, 2019, now U.S. Pat. No. 11,074,390, issued Jul. 27, 2021, which claims priority to U.S. Provisional Application No. 62/738,707, filed Sep. 28, 2018, the entire contents of which are hereby incorporated by reference in their entireties.

BACKGROUND

Integrated circuits (ICs) include a number of devices such as transistors, resistors and capacitors. These devices are initially isolated from each other, and are later interconnected with each other using interconnect structures formed in multiple metallization layers overlying the circuit devices. The interconnect structures connect individual devices to make up a cell, including supplying power to the cell, and connect cells to each other globally (i.e., on a chip-level) to implement the intended function of the integrated circuit. Cell placement and interconnect routing are part of an overall design process for the ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electrical power is distributed to components of an IC over a network of conductors, sometimes referred to as a power grid. The power grid distributes power supply and reference voltages from bond pad locations to the various elements on the IC through power rails. The power rails are interconnect elements arranged within one or more metallization layers in the interconnect structure. Each metallization layer includes conductive elements running horizontally or vertically in a plan view. The metallization layers are stacked such that any adjacent metallization layers have the conductive elements running in, for example, orthogonal directions. A separation between power rails is referred to as a power rail pitch. The power rails are held at a selected voltage potential and are electrically coupled to devices, to provide the voltage potential to the devices. For example, ICs often include a plurality of first power rails held at a source voltage potential (VDD) and a plurality of second power rails held at a ground voltage potential (VSS).

With advanced technologies for forming circuit devices having smaller sizes, the design complexity increases, which leads to more significant power dissipation. Accordingly, a dense power grid with a reduced power rail pitch is used to provide sufficient electric power to all cells within the IC. However, because conductive lines for signal routing (i.e., signal lines) between various cells or between elements within a cell are formed on the same metallization layers as the power rails, the reduced power rail pitch increases the risk of short circuit due to the overlapping between the signal lines and the power rails.

Integrated circuits (ICs) are designed using cells. A cell incudes one or more devices intended to perform a specific function. Cells include routing tracks for routing of signal lines and power rails. A pitch between routing tracks is determined based on the designed node size of the cell. The signal lines and power rails are arranged along the routing tracks in order to assist with design of an interconnect structure for electrically connecting the cells of the IC. The signal lines electrically connect a first element within the cell to a second element in another cell or within the same cell. As discussed above, power rails are used to provide power supply and reference voltages to the cell. In some embodiments, power rails are global elements that extend across numerous cells of the IC.

If a signal line overlaps a power rail, i.e., the power rail extends along a same routing track as the signal line, the power rail will be short circuited to the signal line and the cell will not operate as designed. In order to reduce the risk of a short circuit, in some embodiments, some routing tracks within the cell are reserved as for use by the power rails. Reserving routing tracks at the time at which the cell is designed helps to achieve better cell placement and routing in a chip-level design of the IC.

By designing a cell to reserve certain routing track for use by the power rails, a cell is able to be easily placed in the IC design. In contrast, if the cell does not include reserved routing tracks for power rails, signal lines within the cell will be re-routed during placement of the cell in the IC design in some instances. This re-routing of the signal lines increases an amount of time to complete the IC design and increases complexity of the design. Design complexity increases production costs and risk for manufacturing error.

In some embodiments, an interval of reserved routing tracks is set at a pitch of the power rails. By reserving routing tracks at an interval of the pitch of the power rails, the cell is able to be placed within the chip-level of the IC design without re-routing of signal lines within the cell. However, in some instances, an interval of reserved routing tracks being equal to the pitch of the power rails causes the location of the cells to be adjusted within the chip-level of the IC design in order for the reserved routing tracks to align with the power rails in the IC design.

In some embodiments, the interval of the reserved routing tracks is a fraction of the pitch of the power rails, where the pitch of the power rails is divided by an integer. By reserving routing track at a fractional interval of the pitch of the power rails, the cell is able to be place within the chip-level of the IC design without re-routing of signal lines within the cell. Additionally, a risk of adjusting the position of the cell in the chip-level of the IC design is reduced in comparison with reserved routing tracks at the interval of the pitch of the power rails. Further, in situations where the position of the cell is adjusted within the chip-level of the IC design, a distance between the adjusted cell and an adjacent cell is less than if the reserved routing tracks are at an interval of the pitch of the power rails. As a result, an amount of dead space within the chip-level of the IC design is reduced and an overall size of a device is reduced. Dead space is a portion of the IC design which does not include elements that contribute to the function of the IC.

Figure 1:
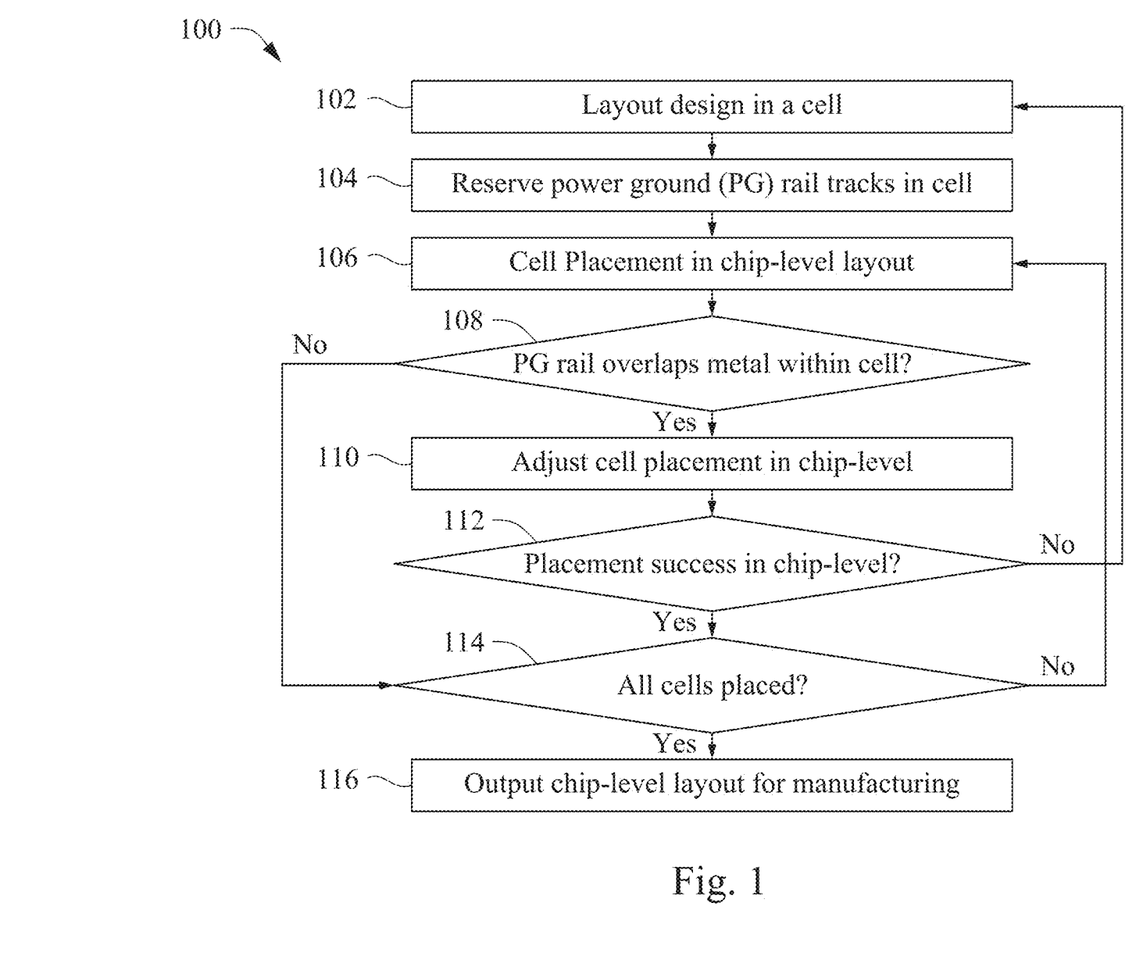
FIG. 1 is a flowchart of a method of designing a chip-level layout in accordance with some embodiments.

FIG. 1 is a flowchart of a method 100 of designing a chip-level layout in accordance with some embodiments. In operation 102, a layout for a cell is designed. The cell includes passive and/or active devices for implementing an intended function of the cell. For example, in some embodiments, an intended function of a cell is as an inverter and the cell includes two transistors. The layout for the cell includes placement of passive and/or active devices within the cell. The layout also includes routing tracks for routing of signal lines and power rails for connections within the cell and between other cells. The routing track run parallel to one another across the cell.

In operation 104, routing tracks are reserved in the cell layout for power rails. A plurality of routing tracks within the cell layout are reserved for the power rails in order to permit at least one power supply and at least one reference voltage to connect to elements within the cell. In some embodiments, an interval between adjacent reserved routing tracks is equal to a pitch between the power rails. The pitch between the power rails is determined based on designed power consumption of the IC and a production node used to produce the IC. In some embodiments, the interval between adjacent reserved routing tracks is a faction of the pitch between the power rails. The fraction is determined by dividing the pitch of the power rails by an integer greater than one. As the integer increases, a number of available routing tracks for receiving the power rails increases. However, routing of signal lines within the cell becomes more complex. In some instances, if the integer is too large the size of the cell is increases in order to provide sufficient ability to route signal lines within the cell. A value for the integer is selected based on a size of the cell and a number of signal lines within the cell.

In operation 106, a cell is placed in a chip-level layout of the IC. The cell is inserted into the chip-level layout adjacent to other cells used to implement the intended function of the IC. In some embodiments, the cell is placed adjacent another cell within the chip-level layout. In some embodiments, the cell is placed spaced from other cells within the chip-level layout.

In operation 108, a determination is made regarding whether any of the power rails overlap with any of the signal lines within the placed cell. If the power rail extends along a same routing track as a signal line, then the power rail is considered to overlap with the signal line. Overlapping between a power rail and a signal line will result in short circuiting within the IC. In some embodiments, the power rails are determined not to overlap with any signal lines if the power rails are aligned with the reserved routing tracks. In some embodiments, a routing track is not a reserved routing track, but nevertheless does not include a signal line. In such instances, a power rail in an unoccupied routing track is not considered to overlap with any signal lines regardless of whether the routing track is a reserved routing track. In response to a determination that the power rails fail to overlap with any of the signal lines within the cell, method 100 proceeds to operation 114. In response to a determination that any power rail overlaps with any signal line, method 100 proceeds to operation 110.

In operation 110, the location of the cell within the chip-level layout is adjusted. The cell is moved in a direction perpendicular to the routing tracks. The cell is moved so that the power rails align with the reserved routing tracks. In some embodiments, a maximum movement distance of the cell is less than the interval between reserved routing tracks.

In operation 112, a determination is made regarding whether the adjusted location of the cell within the chip-level layout is successful. In some embodiments, determining whether the adjusted location of the cell is successful is based on whether the power rails overlap with any of the signal lines. In some embodiments, determining whether the adjusted location of the cell is successful is based on whether the cell is moved a distance greater than the maximum movement distance. In response to a determination that the adjusted location of the cell is successful, method 100 proceeds to operation 114. In response to a determination that the adjusted location of the cell is not successful, method 100 returns to operation 102 and the design of the cell is adjusted.

In some embodiments, adjusting the design of the cell includes changing a location of at least one element within the cell. In some embodiments, adjusting the design of the cell includes changing a location of at least one signal line within the cell. In some embodiments, adjusting the design of the cell includes increasing the number of reserved routing tracks within the cell.

In operation 114, a determination is made regarding whether all of the cells have been placed. The determination is made on based on whether the IC is capable of performing the designed function based on the placed cells. In response to a determination that all cells have been placed, method 100 proceeds with operation 116. In response to a determination that less than all cells have been placed, method 100 returns to operation 106 and a next cell is placed in the chip-level layout of the IC. The placed cell in operation 106 has already been designed and includes reserved routing tracks for power rails.

In operation 116, the chip-level layout is output for manufacturing. In some embodiments, the chip-level layout is saved as a computer file for developing masks for manufacturing of the IC. In some embodiments, the chip-level layout is transmitted to manufacturing equipment for manufacturing of the IC. Additional details of a manufacturing process are described with respect to FIG. 8 below.

In some embodiments, at least one operation of method 100 is omitted. For example, in some embodiments, cell designs are received from an external source and operation 102 is omitted. In some embodiments, additional operations are added to method 100. For example, in some embodiments, routing of signal lines between cells in the chip-level layout is performed as part of method 100. In some embodiments, one operation of method 100 is combined with another operation of method 100. For examples, in some embodiments, operation 102 is combined with operation 104. In some embodiments, an order of operations in method 100 is adjusted. For example, in some embodiments, operation 104 is performed prior to operation 102.

Figure 2:
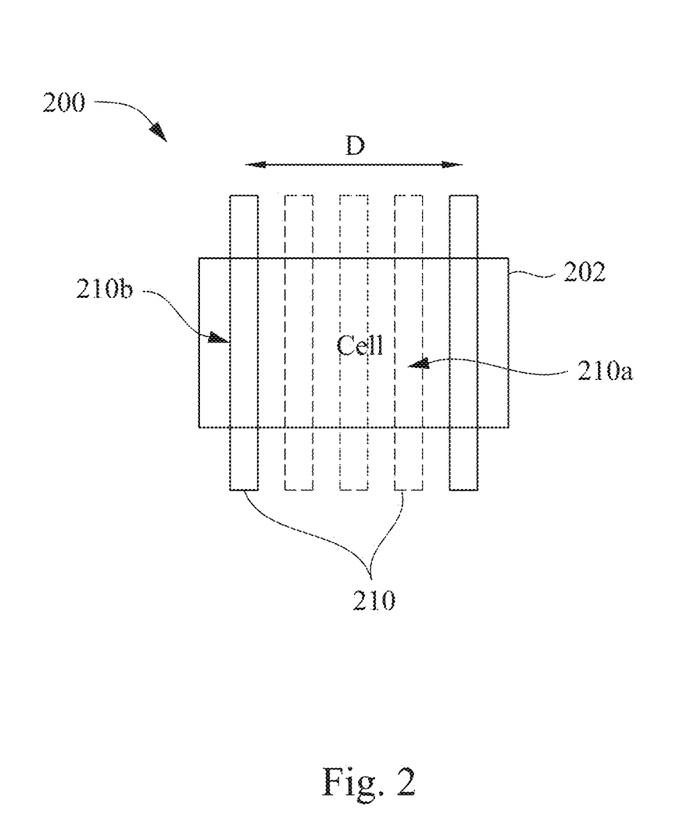
FIG. 2 is a plan view of a cell including routing tracks in accordance with some embodiments.

FIG. 2 is a plan view of a cell 200 including routing tracks in accordance with some embodiments. Cell 200 includes at least one active or passive device (not shown) surrounded by a cell boundary 202. Routing tracks 210 extend across cell 200. In FIG. 2, all of the routing tracks 210 extend across the cell boundary 202. In some embodiments, less than all of the routing tracks 210 extend across the cell boundary 202. Cell 200 includes five routing tracks 210. In some embodiments, a number of routing tracks 210 is more or less than five.

Cell 200 includes two subsets of routing tracks. Routing tracks 210a are routing tracks usable for signal lines for connections between elements within cell 200 or between elements in cell 200 and other cells in the IC. Routing tracks 210b are reserved routing tracks for power rails. In FIG. 2, reserved routing tracks 210b are separated by a distance D equal to a pitch between power rails. In some embodiments, reserved routing tracks 210 are separated by a distance D/n, where n is an integer greater than one, which is a fraction of the pitch between power rails. In FIG. 2, reserved routing tracks 210b are the routing tracks closest to the cell boundary 202. In some embodiments, at least one routing track 210a is between a reserved routing track 210b and the cell boundary 202.

Figure 3A:
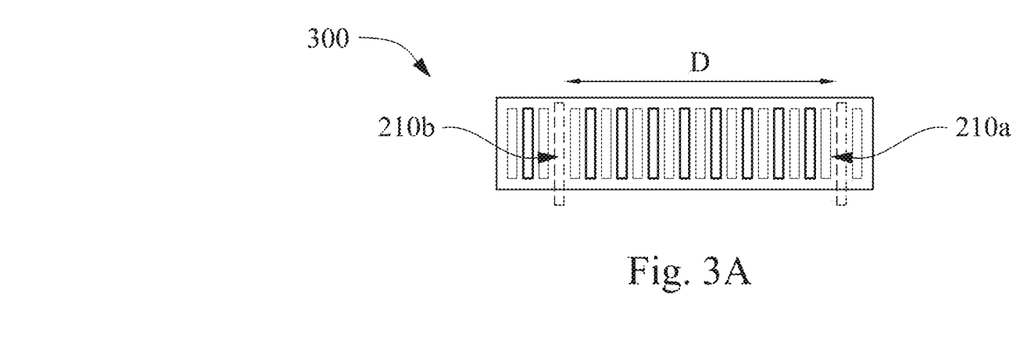
FIG. 3A is a plan view of a cell including reserved routing tracks in accordance with some embodiments.

FIG. 3A is a plan view of a cell 300 including reserved routing tracks in accordance with some embodiments. Cell 300 is similar to cell 200 and same elements have a same reference number. In contrast to cell 200, cell 300 includes routing tracks 210a for signal lines on both sides of reserved routing tracks 210b. Similar to cell 200, a distance between reserved routing tracks 210b is distance D equal to the pitch between power rails.

Figures 3B, 3C:
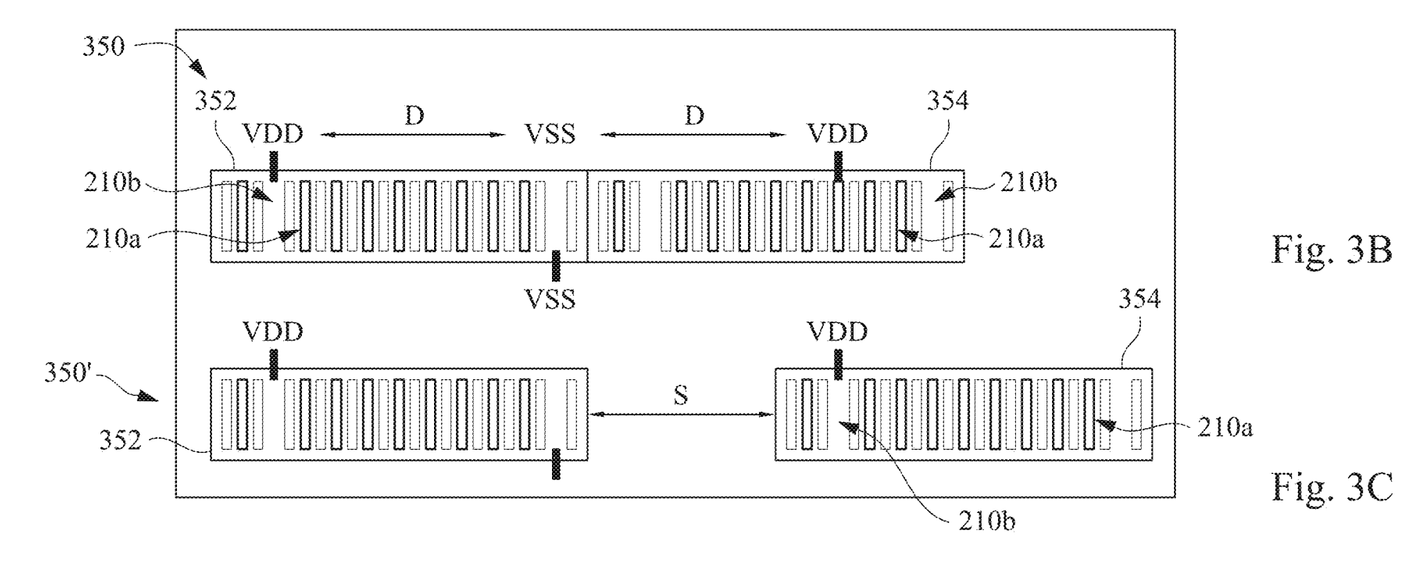
FIG. 3B is a plan view of placement of cells in a chip-level design in accordance with some embodiments.
FIG. 3C is a plan view of placement of cells in a chip-level design in accordance with some embodiments.

FIG. 3B is a plan view of placement of cells in a chip-level design 350 in accordance with some embodiments. FIG. 3B includes an initial placement of cell 354 directly contacting cell 352. Cell 352 and cell 354 are the same as cell 300 in FIG. 3A. Cell 352 and cell 354 both include reserved routing tracks 210b separated by distance D equal to the pitch between power rails. Cell 352 includes reserved routing tracks 210b that align with power rail VDD and power rail VSS. However, in the initial placement of cell 354, the power rail VDD overlaps with a routing track 210a designated for signal lines. As a result, there is a risk of short circuiting in cell 354.

FIG. 3C is a plan view of placement of cells in a chip-level design 350' in accordance with some embodiments. In contrast with chip-level design 350, chip-level design 350' includes cell 354 separated from cell 352 by space S. Cell 354 is moved in a direction perpendicular to a direction of routing tracks 210. The separation between cell 352 and cell 354 aligns power rail VDD with reserved routing track 210b in cell 354.

While the reserved routing tracks 210b in cell 352 and cell 354 avoid re-routing of signal lines along routing tracks 210a, setting an interval of between reserved routing tracks 210b to be distance D results in cell 354 being separated from by space S from cell 352. The dead space resulting from space S causes an overall size of the IC to be increased in comparison with a situation where cell 354 directed contacts cell 352.

Cell 200 includes two subsets of routing tracks. Routing tracks 210a are routing tracks usable for signal lines for connections between elements within cell 200 or between elements in cell 200 and other cells in the IC. Routing tracks 210b are reserved routing tracks for power rails. In FIG. 2, reserved routing tracks 210b are separated by a distance D equal to a pitch between power rails. In some embodiments, reserved routing tracks 210 are separated by a distance D/n, where n is an integer greater than one, which is a fraction of the pitch between power rails. In FIG. 2, reserved routing tracks 210b are the routing tracks closest to the cell boundary 202. In some embodiments, at least one routing track 210a is between a reserved routing track 210b and the cell boundary 202.

Figure 4A:
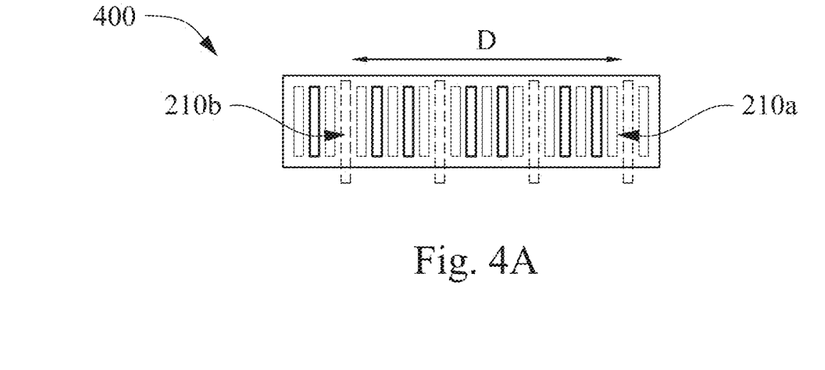
FIG. 4A is a plan view of a cell including reserved routing tracks in accordance with some embodiments.

FIG. 4A is a plan view of a cell 400 including reserved routing tracks in accordance with some embodiments. Cell 400 is similar to cell 200 and same elements have a same reference number. In contrast to cell 200, cell 400 includes routing tracks 210a for signal lines on both sides of reserved routing tracks 210b. In contrast to cell 200, a distance between reserved routing tracks 210b in cell 400 is distance D/n, where n equals four. In some embodiments, n is an integer greater than or less than four. The increased frequency of reserved routing tracks 210b in cell 400 increases a probability of power rails aligning with the reserved routing tracks 210b.

Figure 4B:
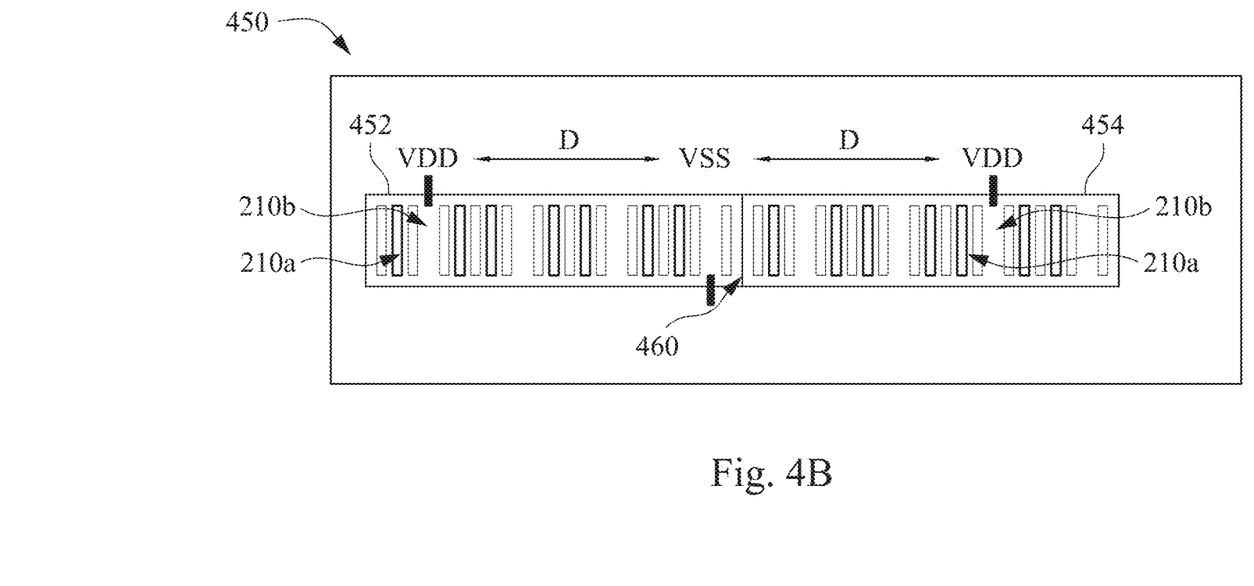
FIG. 4B is a plan view of placement of cells in a chip-level design in accordance with some embodiments.

FIG. 4B is a plan view of placement of cells in a chip-level design 450 in accordance with some embodiments. FIG. 4B includes cell 454 directly contacting cell 452. Cell 452 and cell 454 are the same as cell 400 in FIG. 4A. Cell 452 and cell 454 both include reserved routing tracks 210b separated by distance D/n, where n equals four. Cell 452 includes reserved routing tracks 210b that align with power rail VDD and power rail VSS. In addition, cell 354 includes reserved routing tracks 210b that align with power rail VDD.

In cell 452, the power rail VDD aligns with a left-most reserved routing track 210b. In cell 454, the power rail VDD aligns with a reserved routing track third from the left. This difference in which reserved routing track 210b aligns with the power rail is due to a size of the cells being different from the pitch between power rails. Including additional reserved routing tracks 210b helps to account for these differences in cell size and power rail pitch.

The reserved routing tracks 210b in cell 452 and cell 454 avoid re-routing of signal lines along routing tracks 210a. However, in contract to chip-level design 350', setting an interval of between reserved routing tracks 210b to be distance D/n results in cell 454 directly contacting cell 452. As a result, chip-level design 450 is able to occupy less space than chip-level design 350' and an overall size of the IC is reduced.

Figure 5A:
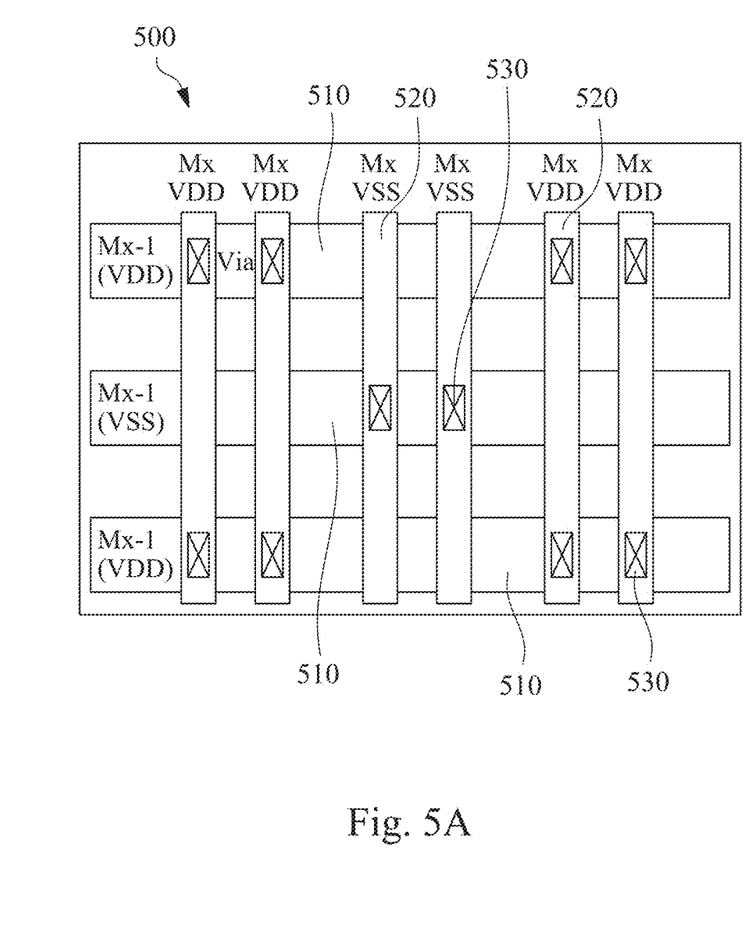
FIG. 5A is a plan view of power straps for providing power to a cell in accordance with some embodiments.

FIG. 5A is a plan view of power straps for providing power to a cell in accordance with some embodiments. In arrangement 500, conductive elements 510 for carrying supply voltage (VDD) and reference voltage (VSS) extend in a first direction. Power straps 520 for connecting to conductive elements 510 extend in a second direction. The second direction is perpendicular to the first direction. In some embodiments, the second direction is at a non-perpendicular angle to the first direction. Vias 530 electrically connect conductive elements 510 to power straps 520. Power straps 520 are intended to extend along reserved routing tracks, e.g., reserved routing tracks 210b, of cells in order to provide power to the cells.

Figure 5B:
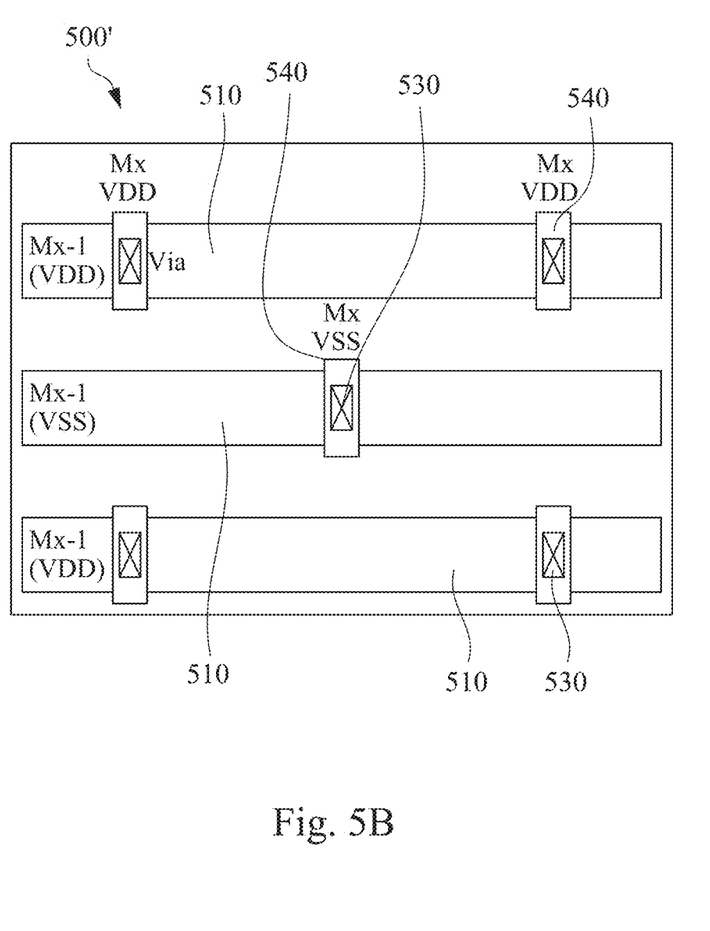
FIG. 5B is a plan view of power stubs for providing power to a cell in accordance with some embodiments.

FIG. 5B is a plan view of power stubs for providing power to a cell in accordance with some embodiments. In contrast with arrangement 500, arrangement 500' includes power stubs 540 in place of power straps 520. Power stubs 540 are electrically connected to conductive elements 510 by vias 530. Power stubs 540 are intended to extend along reserved routing tracks, e.g., reserved routing tracks 210b, of cells in order to provide power to the cells.

Figure 6A:
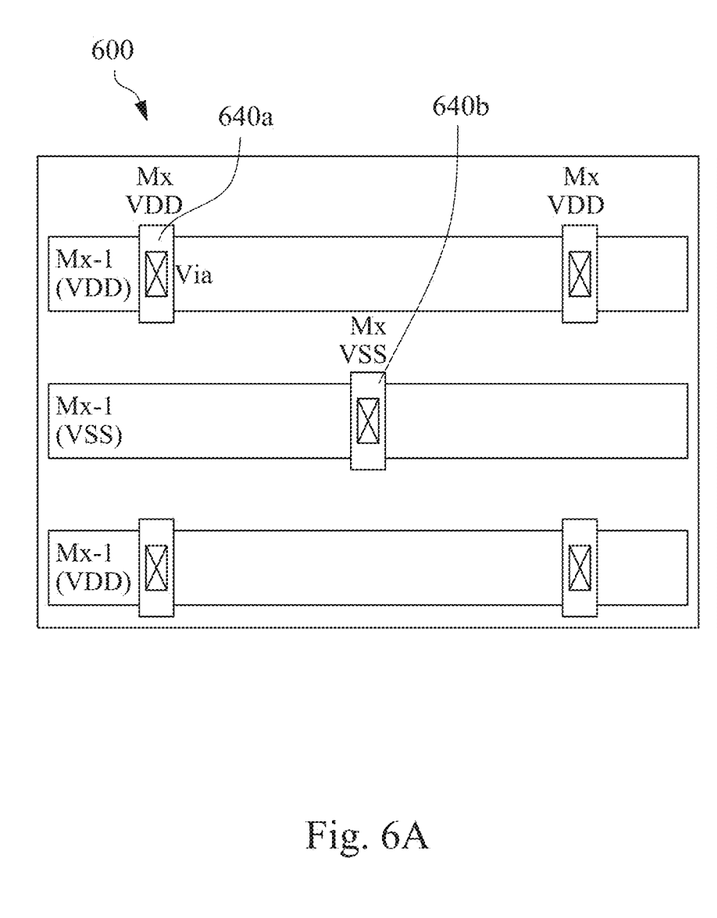
FIG. 6A is a plan view of power stubs in a staggered arrangement for providing power to a cell in accordance with some embodiments.

FIG. 6A is a plan view of power stubs in a staggered arrangement 600 for providing power to a cell in accordance with some embodiments. In staggered arrangement 600, power stubs 640a that are connected to a supply voltage (VDD) are offset in the first direction with respect to power stubs 640b that are connected to a reference voltage (VSS). In staggered arrangement 600, power stubs 640a connected to the supply voltage are aligned in the second direction. Aligning the power stubs 640a in the second direction helps to improve alignment of the power stubs 640a with reserved routing tracks, e.g., reserved routing tracks 210b.

Figure 6B:
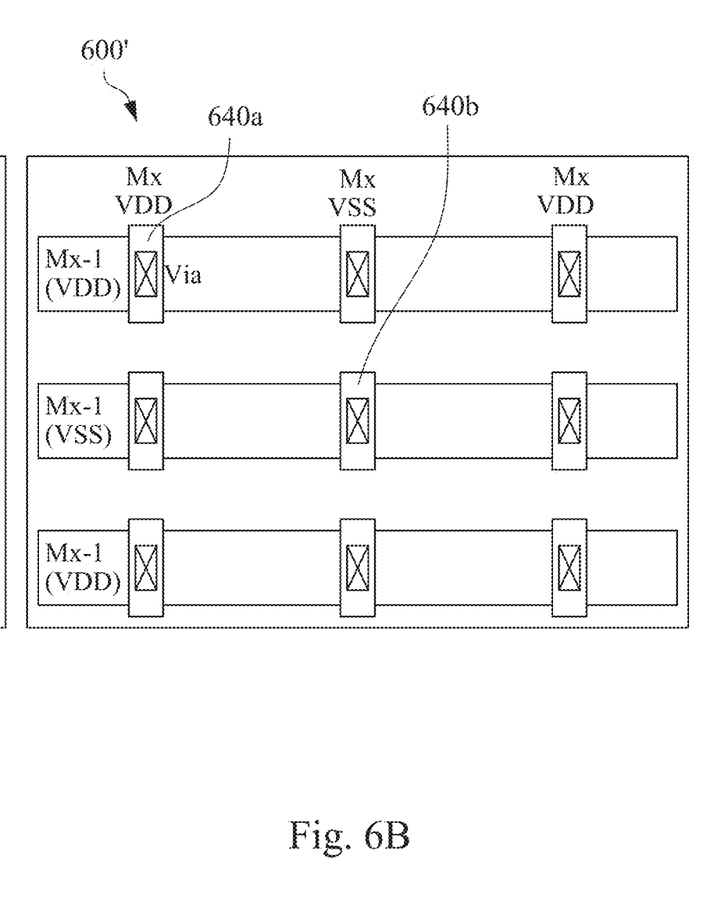
FIG. 6B is a plan view of power stubs in a face-to-face arrangement for providing power to a cell in accordance with some embodiments.

FIG. 6B is a plan view of power stubs in a face-to-face arrangement 600' for providing power to a cell in accordance with some embodiments. In face-to-face arrangement 600', power stubs 640a that are connected to a supply voltage (VDD) are aligned in the second direction with power stubs 640b that are connected to a reference voltage (VSS). In face-to-face arrangement 600, power stubs 640a connected to the supply voltage are aligned in the second direction. Aligning the power stubs 640a and power stubs 640b in the second direction helps to improve alignment with reserved routing tracks, e.g., reserved routing tracks 210b.

Figure 7:
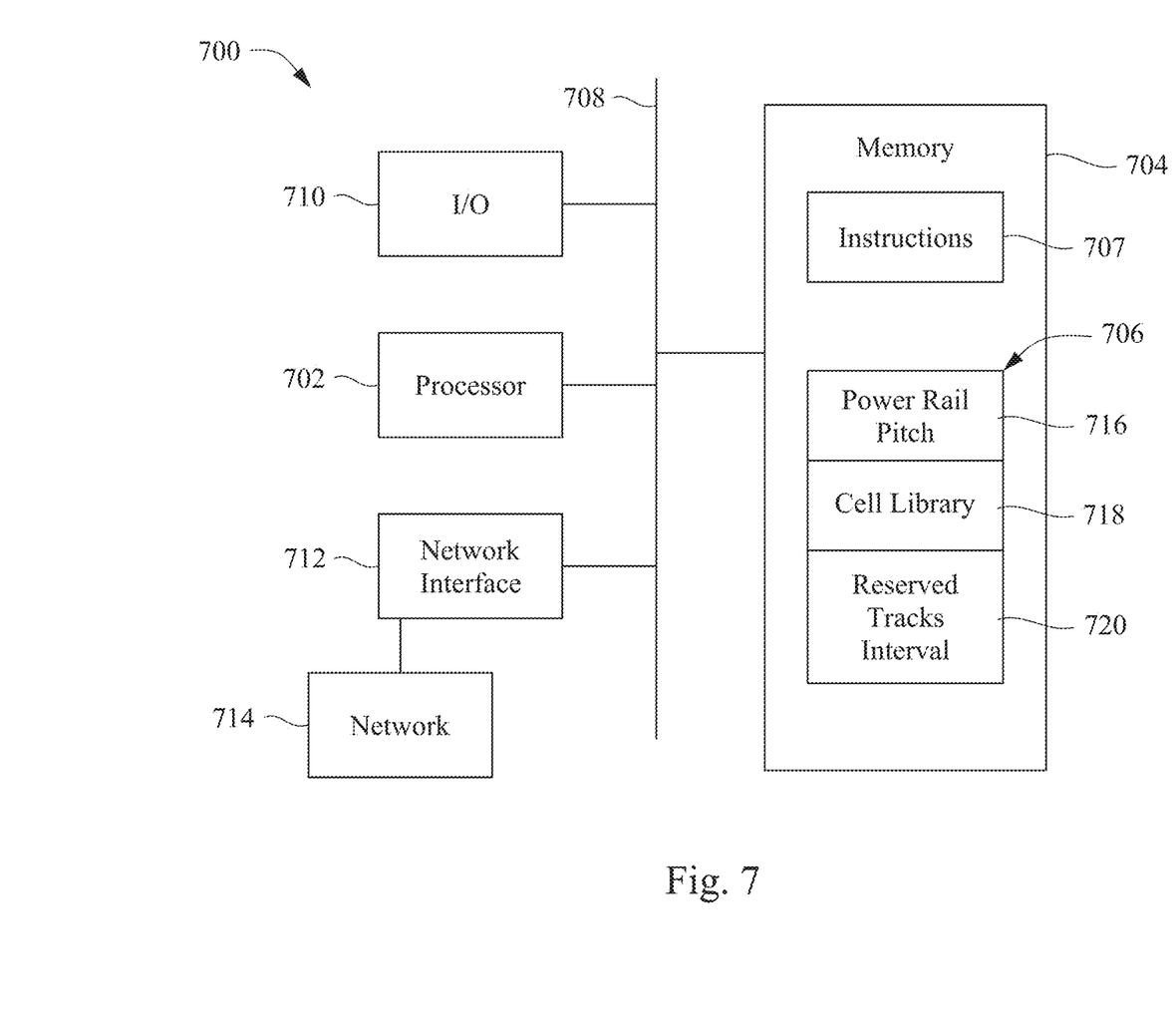
FIG. 7 is a schematic view of a system for designing a chip-level layout in accordance with some embodiments.

FIG. 7 is a schematic view of a system 700 for altering a design for a memory array or executing a production process for either a floating gate memory array or a charge trapping memory array in accordance with one or more embodiments. System 700 includes a hardware processor 702 and a non-transitory, computer readable storage medium 704 encoded with, i.e., storing, the computer program code 706, i.e., a set of executable instructions. Computer readable storage medium 704 is also encoded with instructions 707 for interfacing with manufacturing machines for producing the memory array. The processor 702 is electrically coupled to the computer readable storage medium 704 via a bus 708. The processor 702 is also electrically coupled to an I/O interface 710 by bus 708. A network interface 712 is also electrically connected to the processor 702 via bus 708. Network interface 712 is connected to a network 714, so that processor 702 and computer readable storage medium 704 are capable of connecting to external elements via network 714. The processor 702 is configured to execute the computer program code 706 encoded in the computer readable storage medium 570404 in order to cause system 700 to be usable for performing a portion or all of the operations as described in method 100.

In some embodiments, the processor 702 is a central processing unit (CPU), a multi-processor, a distributed processing system, an application specific integrated circuit (ASIC), and/or a suitable processing unit.

In some embodiments, the computer readable storage medium 704 is an electronic, magnetic, optical, electromagnetic, infrared, and/or a semiconductor system (or apparatus or device). For example, the computer readable storage medium 704 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 704 includes a compact disk-read only memory (CD-ROM), a compact disk-read/write (CD-R/W), and/or a digital video disc (DVD).

In some embodiments, the storage medium 704 stores the computer program code 706 configured to cause system 700 to perform method 100. In some embodiments, the storage medium 704 also stores information needed for performing a method 100 as well as information generated during performing the method 100, such as a power rail parameter 706, a cell library parameter 718, a reserved tracks interval parameter 720 and/or a set of executable instructions to perform the operation of method 100.

In some embodiments, the storage medium 704 stores instructions 707 for interfacing with manufacturing machines. The instructions 707 enable processor 702 to generate manufacturing instructions readable by the manufacturing machines to effectively implement method 100 during a manufacturing process.

System 700 includes I/O interface 710. I/O interface 710 is coupled to external circuitry. In some embodiments, I/O interface 710 includes a keyboard, keypad, mouse, trackball, trackpad, and/or cursor direction keys for communicating information and commands to processor 702.

System 700 also includes network interface 712 coupled to the processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interface such as ETHERNET, USB, or IEEE-1394. In some embodiments, method 100 is implemented in two or more systems 700, and information is exchanged between different systems 700 via network 714.

System 700 is configured to receive information related to a technology node for manufacturing through I/O interface 710 or network interface 712. The information is transferred to processor 702 via bus 708 to determine a power rail pitch for the production of process. The power rail pitch is then stored in computer readable medium 704 as power rail pitch parameter 716. System 700 is configured to receive information related to a cell design through I/O interface 710 or network interface 712. The information is stored in computer readable medium 704 as cell library parameter 718. System 700 is configured to receive information related to an interval of reserved routing tracks through I/O interface 710 or network interface 712. The information is stored in computer readable medium 704 as reserved tracks interval parameter 720.

During operation, processor 702 executes a set of instructions to determine a chip-level layout of an IC based on power rail pitch parameter 716, cell library 718 and reserved tracks interval 720. In some embodiments, processor 702 is configured to receive instructions for modifying a cell design in cell library parameter 718 in response to failure to successfully place a cell in the chip-level layout. In some embodiments, processor 702 is configured to modify the reserved tracks interval parameter 720 based on an intended size of the IC and/or a complexity of routing of signal lines within a cell in cell library parameter 718.

Figure 8:
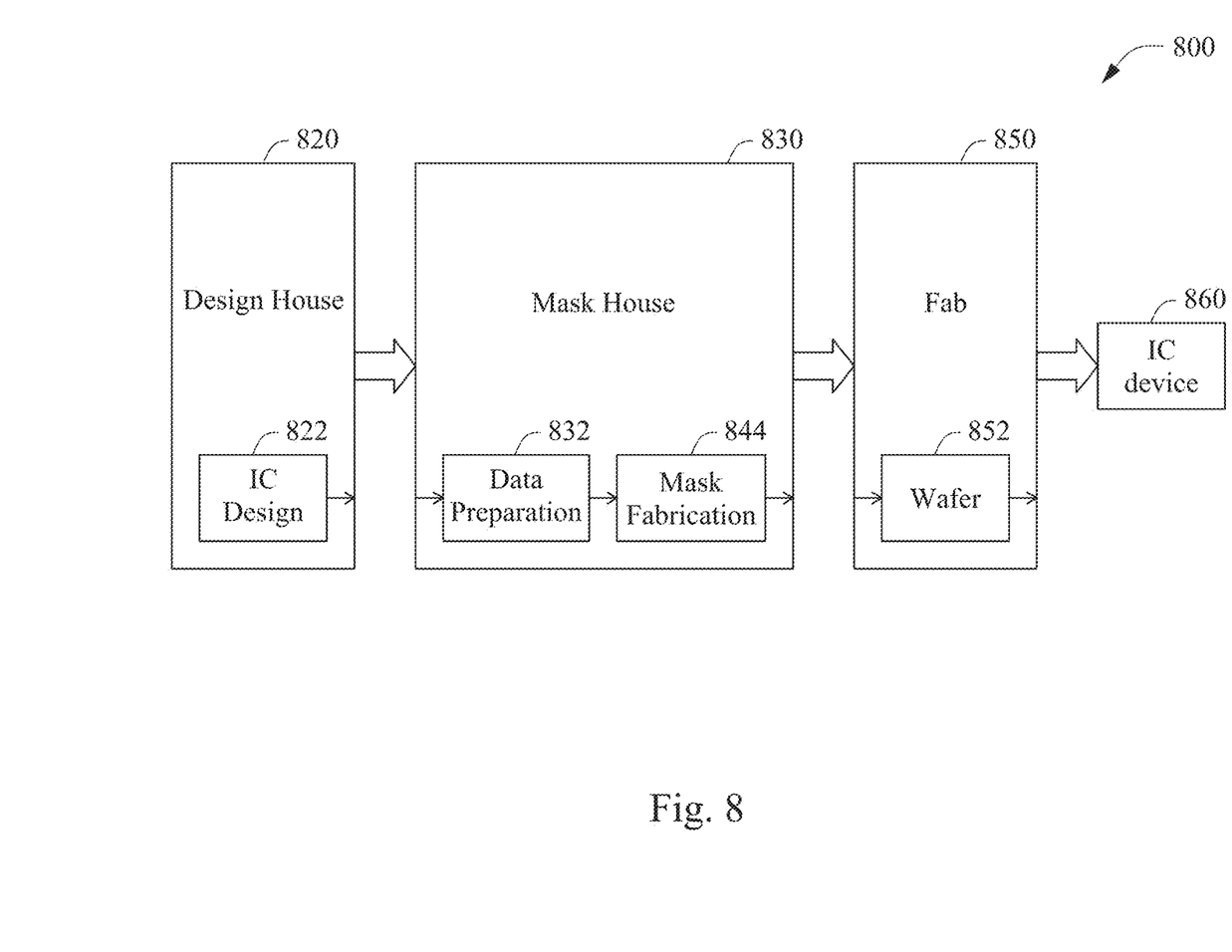
FIG. 8 is a block diagram of an integrated circuit (IC) manufacturing system and an IC manufacturing flow associated therewith, in accordance with some embodiments.

FIG. 8 is a block diagram of an integrated circuit (IC) manufacturing system 800 and an IC manufacturing flow associated therewith, in accordance with some embodiments.

In general, system 800 generates a layout. Based on the layout, system 800 fabricates at least one of (A) one or more semiconductor masks or (b) at least one component in a layer of an inchoate semiconductor integrated circuit.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout 822. IC design layout 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout 822. The design procedure includes one or more of logic design, physical design or place and route. IC design layout 822 is presented in one or more data files having information of the geometrical patterns. For example, IC design layout 822 can be expressed in a GDSII file format or DFII file format.

Mask house 830 includes data preparation 832 and mask fabrication 844. Mask house 830 uses IC design layout 822 to manufacture one or more masks to be used for fabricating the various layers of IC device 860 according to IC design layout 822. Mask house 830 performs mask data preparation 832, where IC design layout 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) or a semiconductor wafer. The design layout is manipulated by mask data preparation 832 to comply with particular characteristics of the mask writer and/or requirements of IC fab 820. In FIG. 8, mask data preparation 832 and mask fabrication 844 are separate elements. In some embodiments, mask data preparation 832 and mask fabrication 844 are collectively referred to as mask data preparation.

In some embodiments, mask data preparation 832 includes optical proximity correction (OPC) which uses lithography enhancement techniques to compensate for image errors, such as those that can arise from diffraction, interference, other process effects or the like. OPC adjusts IC design layout 822. In some embodiments, mask data preparation 832 includes further resolution enhancement techniques (RET), such as off-axis illumination, sub-resolution assist features, phase-shifting masks, other suitable techniques, or the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, or the like. In some embodiments, the MRC modifies the IC design layout to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, or the like or combinations thereof. In some embodiments, after a simulated manufactured device has been created by LPC, if the simulated device is not close enough in shape to satisfy design rules, OPC and/or MRC are be repeated to further refine IC design layout 822.

It should be understood that the above description of mask data preparation 832 has been simplified for the purposes of clarity. In some embodiments, data preparation 832 includes additional features such as a logic operation (LOP) to modify the IC design layout according to manufacturing rules. Additionally, the processes applied to IC design layout 822 during data preparation 832 may be executed in a variety of different orders.

After mask data preparation 832 and during mask fabrication 844, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in the semiconductor wafer, in an etching process to form various etching regions in the semiconductor wafer, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses the mask (or masks) fabricated by mask house 830 to fabricate IC device 860. Thus, IC fab 850 at least indirectly uses IC design layout 822 to fabricate IC device 860. In some embodiments, a semiconductor wafer 852 is fabricated by IC fab 850 using the mask (or masks) to form IC device 860. Semiconductor wafer 852 includes a silicon substrate or other proper substrate having material layers formed thereon. Semiconductor wafer further includes one or more of various doped regions, dielectric features, multilevel interconnects, or the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of this description relates to a method includes designing a plurality of cells for a semiconductor device, wherein designing the plurality of cells comprises reserving a routing track within each of the plurality of cells, wherein each of the plurality of cells comprises signal lines for connection to elements within the cell, each of the plurality of cells further comprises a plurality of routing tracks, the reserved routing track is one of the plurality of routing tracks, and the reserved routing track is free of the signal lines. The method further includes placing a first cell of the plurality of cells in a layout of the semiconductor device. The method further includes placing a second cell of the plurality of cells in the layout. The method further includes determining whether any power rails overlap with any of the plurality of routing tracks other than the reserved routing track in the second cell. The method further includes adjusting a distance between the first cell and the second cell in response to a determination that at least one power rail overlaps with at least one routing track of the plurality of routing tracks other than the reserved routing track for the second cell. In some embodiments, adjusting the distance between the first cell and the second cell includes increasing the distance between the first cell and the second cell. In some embodiments, adjusting the distance between the first cell and the second cell includes moving the second cell so that the at least one power rail overlaps with the reserved routing track. In some embodiments, designing the plurality of cells includes designing the first cell having the reserved routing track and a second reserved routing track, and the second reserved routing track is one of the plurality of routing tracks. In some embodiments, placing the first cell includes placing the first cell to have a first power rail overlap the reserved routing track and a second power rail overlap the second reserved routing track. In some embodiments, the first power rail is a source voltage power rail, and the second power rail is a ground voltage power rail. In some embodiments, the method further includes placing a third cell of the plurality of cells in the layout of the semiconductor device in response to no power rail overlapping with any routing track of the plurality of routing tracks other than the reserved routing track for the second cell. In some embodiments, the method further includes developing at least one mask based on the layout of the semiconductor device.

An aspect of this description relates to a method. The method includes designing a plurality of cells for a semiconductor device, wherein designing the plurality of cells comprises reserving a routing track within each of the plurality of cells, wherein each of the plurality of cells comprises signal lines for connection to elements within the cell, each of the plurality of cells further comprises a plurality of routing tracks, the reserved routing track is one of the plurality of routing tracks, and the reserved routing track is free of the signal lines. The method further includes placing a first cell of the plurality of cells in a layout of the semiconductor device. The method further includes determining whether all cells for the semiconductor device are placed. The method further includes placing a second cell of the plurality of cells in the layout in response to a determination that less than all cells for the semiconductor device are placed, wherein placing the second cell comprises positioning the second cell such that no power rail overlaps any routing track of the second cell other than a reserved routing track of the second cell. In some embodiments, the method further includes placing a third cell of the plurality of cells in the layout of the semiconductor device. In some embodiments, the method further includes determining whether any power rails overlap with any of the plurality of routing tracks other than the reserved routing track in the third cell. In some embodiments, the method further includes adjusting a distance between the first cell and the third cell in response to a determination that at least one power rail overlaps with at least one routing track of the plurality of routing tracks other than the reserved routing track for the third cell. In some embodiments, the method further includes determining whether any power rails overlap with any of the plurality of routing tracks other than the reserved routing track in the third cell following adjusting the distance between the first cell and the third cell. In some embodiments, placing the second cell includes placing the second cell after adjusting the distance between the first cell and the third cell. In some embodiments, the method further includes developing at least one mask based on the layout of the semiconductor device.

An aspect of this description relates to a system. The system includes a non-transitory computer readable medium configured to store instructions thereon. The system further includes a processor connected to the non-transitory computer readable medium. The processor is configured to execute the instructions for designing a plurality of cells for a semiconductor device, wherein designing the plurality of cells comprises reserving a routing track within each of the plurality of cells, wherein each of the plurality of cells comprises signal lines for connection to elements within the cell, each of the plurality of cells further comprises a plurality of routing tracks, the reserved routing track is one of the plurality of routing tracks, and the reserved routing track is free of the signal lines. The processor is configured to execute the instructions for placing a first cell of the plurality of cells in a layout of the semiconductor device. The processor is configured to execute the instructions for placing a second cell of the plurality of cells in the layout. The processor is configured to execute the instructions for determining whether any power rails overlap with any of the plurality of routing tracks other than the reserved routing track in the second cell. The processor is configured to execute the instructions for adjusting a distance between the first cell and the second cell in response to a determination that at least one power rail overlaps with at least one routing track of the plurality of routing tracks other than the reserved routing track for the second cell. In some embodiments, the processor is configured to execute the instructions for adjusting the distance between the first cell and the second cell by moving the second cell so that the at least one power rail overlaps with the reserved routing track. In some embodiments, the processor is configured to execute the instructions for designing the first cell having the reserved routing track and a second reserved routing track, and the second reserved routing track is one of the plurality of routing tracks. In some embodiments, the processor is configured to execute the instructions for placing a third cell of the plurality of cells in the layout of the semiconductor device in response to no power rail overlapping with any routing track of the plurality of routing tracks other than the reserved routing track for the second cell. In some embodiments, the processor is configured to execute the instructions for developing at least one mask based on the layout of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
designing a plurality of cells for a semiconductor device, wherein designing the plurality of cells comprises reserving a routing track within each of the plurality of cells, wherein each of the plurality of cells comprises signal lines for connection to elements within the cell, each of the plurality of cells further comprises a plurality of routing tracks, the reserved routing track is one of the plurality of routing tracks, and the reserved routing track is free of the signal lines;
placing a first cell of the plurality of cells in a layout of the semiconductor device;
placing a second cell of the plurality of cells in the layout;
determining whether any power rails overlap with any of the plurality of routing tracks other than the reserved routing track in the second cell; and
adjusting a distance between the first cell and the second cell in response to a determination that at least one power rail overlaps with at least one routing track of the plurality of routing tracks other than the reserved routing track for the second cell.

2. The method of claim 1, wherein adjusting the distance between the first cell and the second cell comprises increasing the distance between the first cell and the second cell.

3. The method of claim 1, wherein adjusting the distance between the first cell and the second cell comprises moving the second cell so that the at least one power rail overlaps with the reserved routing track.

4. The method of claim 1, wherein designing the plurality of cells comprises designing the first cell having the reserved routing track and a second reserved routing track, and the second reserved routing track is one of the plurality of routing tracks.

5. The method of claim 4, wherein placing the first cell comprises placing the first cell to have a first power rail overlap the reserved routing track and a second power rail overlap the second reserved routing track.

6. The method of claim 5, wherein the first power rail is a source voltage power rail, and the second power rail is a ground voltage power rail.

7. The method of claim 1, further comprising placing a third cell of the plurality of cells in the layout of the semiconductor device in response to no power rail overlapping with any routing track of the plurality of routing tracks other than the reserved routing track for the second cell.

8. The method of claim 1, further comprising developing at least one mask based on the layout of the semiconductor device.

9. A method comprising:
designing a plurality of cells for a semiconductor device, wherein designing the plurality of cells comprises reserving a routing track within each of the plurality of cells, wherein each of the plurality of cells comprises signal lines for connection to elements within the cell, each of the plurality of cells further comprises a plurality of routing tracks, the reserved routing track is one of the plurality of routing tracks, and the reserved routing track is free of the signal lines;
placing a first cell of the plurality of cells in a layout of the semiconductor device;
determining whether all cells for the semiconductor device are placed; and
placing a second cell of the plurality of cells in the layout in response to a determination that less than all cells for the semiconductor device are placed, wherein placing the second cell comprises positioning the second cell such that no power rail overlaps any routing track of the second cell other than a reserved routing track of the second cell.

10. The method of claim 9, further comprising placing a third cell of the plurality of cells in the layout of the semiconductor device.

11. The method of claim 10, further comprising determining whether any power rails overlap with any of the plurality of routing tracks other than the reserved routing track in the third cell.

12. The method of claim 11, further comprising adjusting a distance between the first cell and the third cell in response to a determination that at least one power rail overlaps with at least one routing track of the plurality of routing tracks other than the reserved routing track for the third cell.

13. The method of claim 12, further comprising determining whether any power rails overlap with any of the plurality of routing tracks other than the reserved routing track in the third cell following adjusting the distance between the first cell and the third cell.

14. The method of claim 13, wherein placing the second cell comprises placing the second cell after adjusting the distance between the first cell and the third cell.

15. The method of claim 9, further comprising developing at least one mask based on the layout of the semiconductor device.

16. A system comprising:
 a non-transitory computer readable medium configured to store instructions thereon; and
 a processor connected to the non-transitory computer readable medium, wherein the processor is configured to execute the instructions for:
  designing a plurality of cells for a semiconductor device, wherein designing the plurality of cells comprises reserving a routing track within each of the plurality of cells, wherein each of the plurality of cells comprises signal lines for connection to elements within the cell, each of the plurality of cells further comprises a plurality of routing tracks, the reserved routing track is one of the plurality of routing tracks, and the reserved routing track is free of the signal lines;
  placing a first cell of the plurality of cells in a layout of the semiconductor device;
  placing a second cell of the plurality of cells in the layout;
  determining whether any power rails overlap with any of the plurality of routing tracks other than the reserved routing track in the second cell; and
  adjusting a distance between the first cell and the second cell in response to a determination that at least one power rail overlaps with at least one routing track of the plurality of routing tracks other than the reserved routing track for the second cell.

17. The system of claim 16, wherein the processor is configured to execute the instructions for adjusting the distance between the first cell and the second cell by moving the second cell so that the at least one power rail overlaps with the reserved routing track.

18. The system of claim 16, wherein the processor is configured to execute the instructions for designing the first cell having the reserved routing track and a second reserved routing track, and the second reserved routing track is one of the plurality of routing tracks.

19. The system of claim 16, wherein the processor is configured to execute the instructions for placing a third cell of the plurality of cells in the layout of the semiconductor device in response to no power rail overlapping with any routing track of the plurality of routing tracks other than the reserved routing track for the second cell.

20. The system of claim 16, wherein the processor is configured to execute the instructions for developing at least one mask based on the layout of the semiconductor device.

* * * * *